United States Patent [19]

Pankove

[11] 3,865,655

[45] Feb. 11, 1975

[54] METHOD FOR DIFFUSING IMPURITIES INTO NITRIDE SEMICONDUCTOR CRYSTALS

[75] Inventor: Jacques Isaac Pankove, Princeton, N.J.

[73] Assignee: RCA Corporation, New York, N.Y.

[22] Filed: Sept. 24, 1973

[21] Appl. No.: 399,822

[52] U.S. Cl. .................. 148/189, 148/186, 148/187

[51] Int. Cl. .............................................. H01l 7/44

[58] Field of Search ............ 148/189, 187, 186, 171

[56] References Cited

UNITED STATES PATENTS

| | | | |
|---|---|---|---|
| 3,540,952 | 11/1970 | Ehle | 148/189 |
| 3,554,818 | 1/1971 | Lambert et al. | 148/189 X |
| 3,592,704 | 7/1971 | Logan et al. | 148/171 |
| 3,603,833 | 9/1971 | Logan et al. | 148/171 X |
| 3,683,240 | 8/1972 | Pankove | 148/175 X |
| 3,764,414 | 10/1973 | Blum et al. | 148/189 |

OTHER PUBLICATIONS

Logan et al., J. Electrochem. Soc. Vol. 119, No. 12, Dec. 1972, pp. 1727–1735. TP250.A 54j.

Maruska et al., Applied Physics Letters, Vol. 15, No. 10, Nov. 15, 1969, pp. 327–329. QC 1.A 475.

*Primary Examiner*—G. Ozaki

*Attorney, Agent, or Firm*—Glenn H. Bruestle; Donald S. Cohen

[57] ABSTRACT

A nitride semiconductor crystal is heated in an ammonia atmosphere and exposed to vaporized acceptor impurities to introduce the impurities into the crystal.

4 Claims, 1 Drawing Figure

PATENTED FEB 11 1975 3,865,655
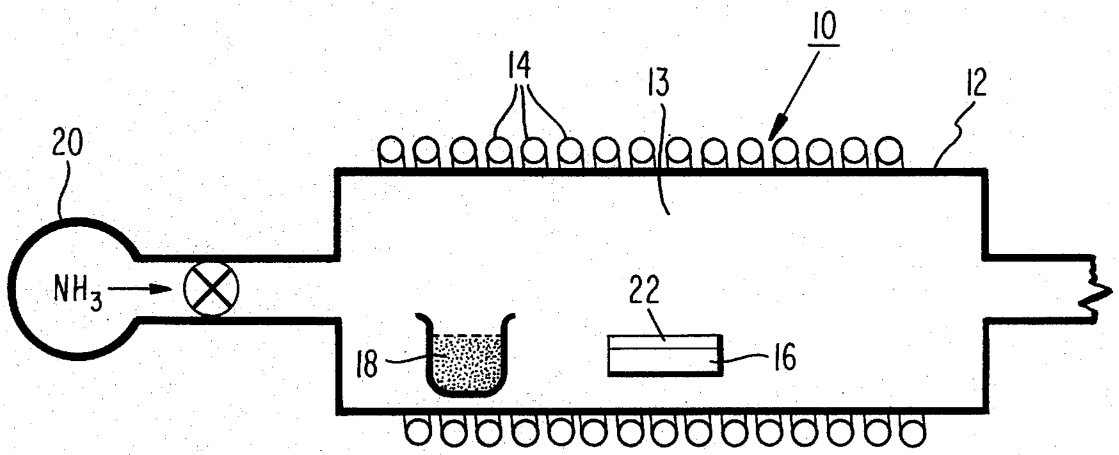

METHOD FOR DIFFUSING IMPURITIES INTO NITRIDE SEMICONDUCTOR CRYSTALS

BACKGROUND OF THE INVENTION

This invention relates to a method of diffusing a dopant into a nitride semiconductor material.

In the past, acceptor impurities, such as Li, Mg, and Zn could only be introduced into a single crystalline nitride body, such as InN, GaN, or AlN, by the method of epitaxial growth; any attempt at doping by diffusion was unsuccessful. This failure was due to the decomposition of the nitride crystals. Specifically, when a single crystalline nitride, such as GaN, is heated to a temperature above 1000°C it decomposes, and decomposition has taken place superficially at temperatures as low as 700°C. Thus, the decomposition of GaN, InN, and AlN results in the release of the nitrogen atoms into the ambient leaving a monolayer of Ga, In, or Al which blocks the penetration of acceptor impurities, if doping is by diffusion.

SUMMARY OF THE INVENTION

A dopant is diffused into a nitride body by bringing the dopant into contact with the nitride body in an ammonia atmosphere while heating the nitride body.

BRIEF DESCRIPTION OF THE DRAWING

FIGURE of the drawing is a cross-sectional, schematic view of an apparatus for carrying out the method of the present invention.

DETAILED DESCRIPTION

Referring to the drawing, an apparatus suitable for carrying out the method of the present invention is generally designated as 10. The apparatus 10 comprises a diffusion furnace 12 with diffusion chamber 13 and heating coils 14. A host nitride crystal 16 is placed into diffusion furnace 12 along with the acceptor impurity 18. A source of ammonia 20 is connected to the inlet of diffusion furnace 12.

To carry out the method of the present invention, after the host nitride crystal 16 and the acceptor impurity 18 have been placed in furnace 12, ammonia from source 20 is admitted into diffusion chamber 13. When sufficient ammonia has been introduced into diffusion chamber 13, such that the atmosphere therein is totally ammonia, the host nitride crystal 16 and the acceptor impurity 18 are heated by coils 14. If, for example the nitride crystal is GaN, it is positioned in chamber 13 such that coils 14 will heat it in the range of 900°C to 1,100°C, and the acceptor impurity 18, if it is Zn, it is positioned in chamber 13 such that coils 14 heat it to a temperature in the range of 400°C to 700°C. If the acceptor impurity 18 is Mg it would be heated in a temperature range of 500°C. to 900°C. and for Li in the range of 600°C. to 1,000°C. The acceptor impurity 18 is heated to that temperature where the impurity is vaporized into the ammonia atomosphere to form a partial pressure in the range of $10^{-1}$ to $10^{3}$ torr.

Heating the nitride crystal 16 to temperatures necessary for diffusion doping first results in the nitrogen atom escaping from the nitride crystal's molecular structure, but because heating takes place in an ammonia atomosphere, a second molecular reaction occurs. The second molecular reaction is that the reactive ammonia exchanges its hydrogen atom for the remaining metal atom of the nitride crystal. Thus there is a resynthesis of the nitride at the surface of the crystal with no net decomposition. While the recombination molecular reaction is occurring, the acceptor impurity 18, which has been vaporized into the ammonia atmosphere, is introduced into the surface layer 22 of the nitride crystal 16 and penetrates the nitride crystal 16. Thus, the nitride crystal 16 is doped to some depth below its surface layer 22.

To confine the area on the surface layer 22 into which the acceptor impurity is diffused, a masking layer of silicon nitride may be placed on that portion of surface layer 22 where the doping is not wanted. Silicon nitride is used as the masking layer since it is stable in an ammonia atmosphere.

The doped nitride bodies can be made into desired semiconductor bodies that can be used to make improved optical waveguide, electro-optical modulators and as a material for generating surface waves. Specifically, when current is passed through the doped layer of GaN, electroluminescence is obtained, as described in U.S. Pat. No. 3,683,240 to J. I. Pankove, issued Aug. 8, 1972, entitled "Electroluminescent Semiconductor Device of GaN."

The nitride crystals 16 that can be used in the present method of diffusion are GaN, InN, AlN and their alloys. The impurity acceptor 18 that may be used are Zn, Mg, and Li.

I claim:

1. A method of diffusing a dopant into a nitride body comprising the steps of:

contacting the nitride body with the dopant in an ammonia atomosphere while heating said body.

2. The method of claim 1 in which the nitride body is selected from the group consisting of GaN, InN, AlN and their alloys.

3. The method of claim 1 in which the dopant is either Li, Mg, or Zn.

4. The method of claim 3 in which the nitride body is of GaN which is heated in the range of 900°C to 1,100°C, if the dopant is Zn it is heated in the range of 400°C to 700°C, or if the dopant is Mg, it is heated in the range of 500°C to 900°C, or if the dopant is Li, it is heated in the range of 600°C to 1,000°C.

* * * * *